United States Patent [19]

Coburn et al.

[11] Patent Number: 4,782,286

[45] Date of Patent: Nov. 1, 1988

[54] LIGHT LOAD ADJUSTMENT AND AIR GAP STABILIZATION IN VOLTAGE STATORS

[75] Inventors: David C. Coburn, Somersworth, N.H.; Aaron R. Dennis, Fort Wayne, Ind.; Glenn A. Watts, Eliot, Me.

[73] Assignee: General Electric Company, Somersworth, N.H.

[21] Appl. No.: 944,073

[22] Filed: Dec. 22, 1986

[51] Int. Cl.$^4$ ............................................. G01R 11/02
[52] U.S. Cl. ...................................... 324/137; 324/138
[58] Field of Search .................. 324/137, 138; 29/609; 336/178, 210, 216; 228/179

[56] References Cited

U.S. PATENT DOCUMENTS

| | | | |
|---|---|---|---|
| 2,699,532 | 1/1955 | Bussing | 336/178 |
| 2,862,183 | 11/1958 | Palmer | 324/137 |
| 3,849,876 | 11/1974 | Graefnitz | 324/137 |

*Primary Examiner*—Reinhard J. Eisenzopf
*Assistant Examiner*—Anthony L. Miele
*Attorney, Agent, or Firm*—Robert E. Brunson; Thomas R. Morrison

[57] ABSTRACT

Non-magnetic metallic spacers are welded into the auxiliary air gaps of a voltage stator using welding passes arranged in a predetermined sequence. The presence of the spacers stabilizes the auxiliary air gap against change in light load adjustment. Sequences of welding passes are disclosed effective for holding inherent light load error at nominal values, or biasing it positively or negatively.

7 Claims, 4 Drawing Sheets

LIGHT LOAD ADJUSTMENT AND AIR GAP STABILIZATION IN VOLTAGE STATORS

BACKGROUND OF THE INVENTION

The present invention relates to electric watthour meters and, more particularly, to voltage stators for watthour meters.

A conventional watthour meter employs a metallic disk supported for rotation by the interaction of eddy currents with magnetic fluxes produced by current and voltage stators disposed adjacent the disk. The rotation of the disk is retarded by a permanent magnet whose retarding torque is proportional to disk rotational speed. The torque producing rotation is proportional to the product of a load current times a voltage; that is, the torque is proportional to the power consumed by the load. the interaction of driving and retarding torques results in the disk rotational speed also being proportional to the power consumed by the load. Each rotation of the disk represents a predetermined quantum of energy consumption. The turns of the disk are accumulated to sum up the consumed energy in units such as, for example, watthours or kilowatt hours.

A conventional voltage stator, sometimes called a pot stator, employs a core built up of a stack of mutually-insulated, generally E-shaped, lamellae of magnetic material such as, for example steel. A coil of many turns of fine wire is disposed on the center leg of the core. Line voltage is applied to the coil to produce a magnetic flux in the core proportional to the line voltage. A magnetic flux appears in the two air gaps between the outside legs and the central leg. This magnetic flux interacts with the disk to induce eddy currents therein which, in turn, interact with a magnetic flux produced by the current stator.

A watthour meter is a precision measurement instrument required to operate with high accuracy over a large dynamic range of load power consumption. For example, an electric meter may be required to measure power consumption with an accuracy of better then one percent over a range of power consumption from about 10 percent to about 600 percent of test current with normal load voltage applied. Thus, accuracy must be maintained over a power ratio of about 60 or more.

Electric watthour meters provide for several adjustments to compensate for inevitable errors arising during manufacture. One adjustment compensates for errors in torque produced at a light load of 10 percent of test current and a power factor of 1.0 Such errors may arise from core nonlinearity; that is, at 10 percent of test amperes, the iron in the core may exhibit other than 10 percent of the flux produced when it receives test amperes. Other possible causes of light-load errors may arise due to friction or to mechanical or magnetic dissymmetries A light load adjustment conventionally consists of a plate of conducting material, positioned in the space between the poles of the core and the disk, and means for adjusting its position in the space at right angles to the disk radius.

The effect of the light load adjustment is critically dependent on the magnitude of the main air gap flux (between the center leg of the core) and the disk. This magnitude, is, in turn, critically dependent on the magnitudes of the magnetic fluxes in the two auxiliary air gaps (between the two outside legs and the center leg of the core).

Theoretically, at least, the causes of light load error are constant for a given watthour meter. Thus, in theory, once the light load adjustment is properly completed, the compensation should be permanent without requiring further adjustment. In practice, however, changes in light load adjustment, once considered to be mysterious, do occur.

We have traced at least part of the change in light load adjustment to disturbance in the positions or spacing of the auxiliary air gaps. We observed that a watthour meter, properly adjusted for light load, frequently goes out of adjustment when it is subjected to shock or high levels of vibration.

OBJECTS AND SUMMARY OF THE INVENTION

Accordingly, it is an object of the invention to provide means for reducing a change in light load adjustment.

It is a further object of the invention to provide means for stabilizing the auxiliary air gaps in the voltage stator of an electric watthour meter.

It is a further object of the invention to provide means for stabilizing the auxiliary air gaps in the voltage stator of an electric watthour meter thereby permitting a predetermined bias of an intrinsic light load error.

Briefly stated, the present invention provides non-magnetic metallic spacers welded into the auxiliary air gaps of a voltage stator using welding passes arranged in a predetermined sequence. The presence of the spacers stabilizes the auxiliary air gap against change in light load adjustment. Sequences of welding passes are disclosed effective for holding inherent light load error at nominal values, or biasing it positively or negatively.

According to an embodiment of the invention, there is provided a voltage stator comprising: an E-shaped core, a voltage stator coil on the E-shaped core, first and second auxiliary air gaps in the E-shaped core, a first non-magnetic metallic spacer in the first auxiliary air gap, a second non-magnetic metallic spacer in the second auxiliary air gap, and means of securing the first and second non-magnetic metallic spacers in their respective auxiliary air gaps.

According to a feature of the invention, there is provided a method for stabilizing first and second auxiliary air gaps in a core of a voltage stator, comprising: forming first and second facing grooves in facing surfaces of the first auxiliary air gap, inserting a first non-magnetic metallic spacer in the first and second facing grooves, the first, non-metallic spacer forming first and second interface lines with contiguous portions of the voltage stator core, forming third and fourth facing grooves in facing surfaces of the second auxiliary air gap, inserting a second non-magnetic metallic spacer in the third and fourth facing grooves, the second non-metallic spacer forming third and fourth interface lines with contiguous portions of the second auxiliary air gap, forming a first weld in a first direction at a first one of the first, second, third and fourth interface lines, forming a second weld in a second direction at a second one of the first, second, third and fourth interface lines, forming a third weld in a third direction at a third one of the first, second, third and fourth interface lines, forming a fourth weld in a fourth direction at fourth one of the first, second, third and fourth interface lines, and selecting a sequence of the first one, second one, third one and fourth one effective for controlling an inherent light load error in the voltage stator.

According to a further feature of the invention, there is provided a method for stabilizing first and second auxiliary air gaps in a voltage stator comprising: affixing a first non-magnetic metallic spacer in the first auxiliary air gap using first and second welds, affixing a second non-magnetic metallic spacer in the second auxiliary air gap using third and fourth welds, and selecting a sequence of the first, second, third and fourth welds giving a selectable one of a positive, negative and zero inherent light load error.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
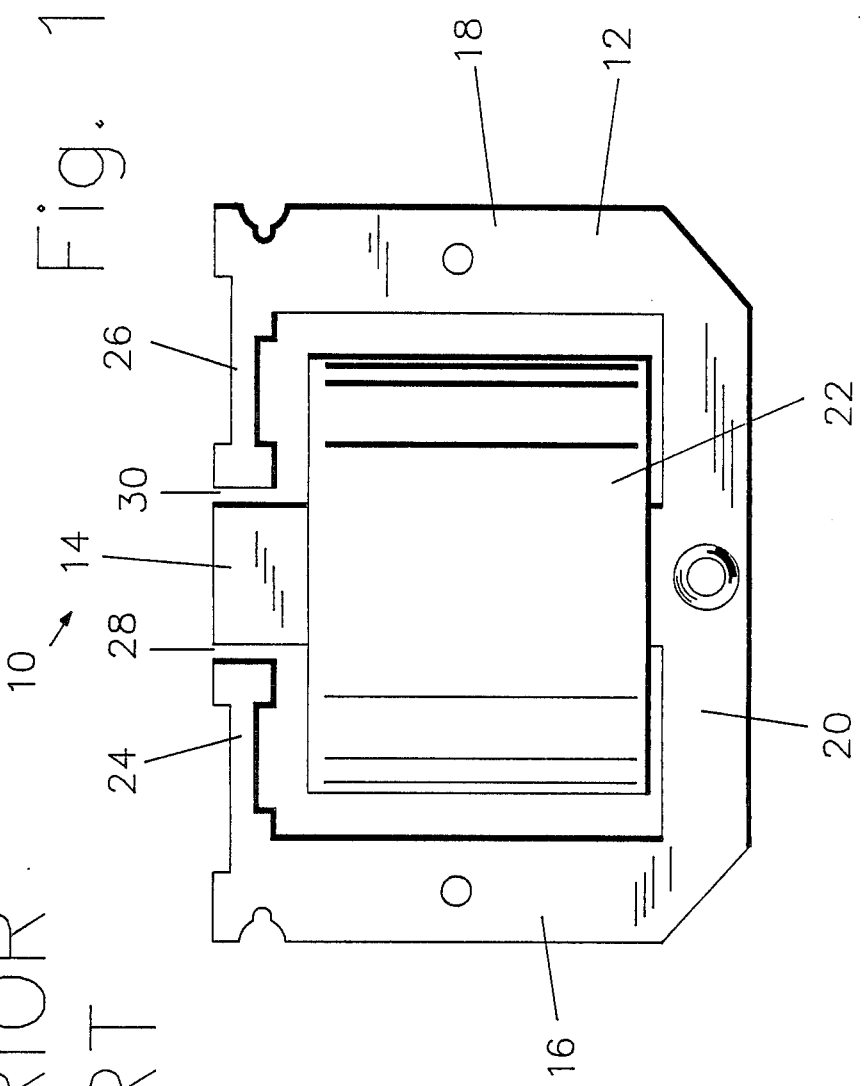
FIG. 1 is side view of a voltage stator according to the prior art.

Referring now to FIG. 1, there is shown, generally at 10, a voltage stator according to the prior art. For purposes of clarity of illustration and description, voltage stator 10 is shown in a state of partial assembly from which several elements found on a fully-assembled voltage stator are omitted. Such omitted elements may include, for example, apparatus for light load adjustment, full load adjustment, lag adjustment and elements for voltage, overload and temperature compensation. Such elements being conventional, their omission herefrom will not interfere with an understanding of the present invention by one skilled in the art.

Voltage stator 10 includes an E-shaped core 12 formed from a stack of thin lamellae (only the end one of which is shown) mutually insulated from each other. E-shaped core 12 includes a center leg 14 joined to first and second side legs 16 and 18 by an end bar 20. A voltage stator coil 22, containing a large number of turns of fine wire, is disposed on center leg 14. Magnetic circuit closure bars 24 and 26 extend inward from side legs 16 and 18, respectively, toward center leg 14 to form auxiliary air gaps 28 and 30, respectively, with facing sides of center leg 14.

The stability of auxiliary air gaps 28 and 30 is critical to light load adjustment. Indeed, we have found that mechanical shock to which electric watthour meters are subjected prior to installation is sometimes sufficient to produce a change in auxiliary air gap 28 and/or 30 large enough to degrade the light-load adjustment out of an acceptable range.

Figure 2:
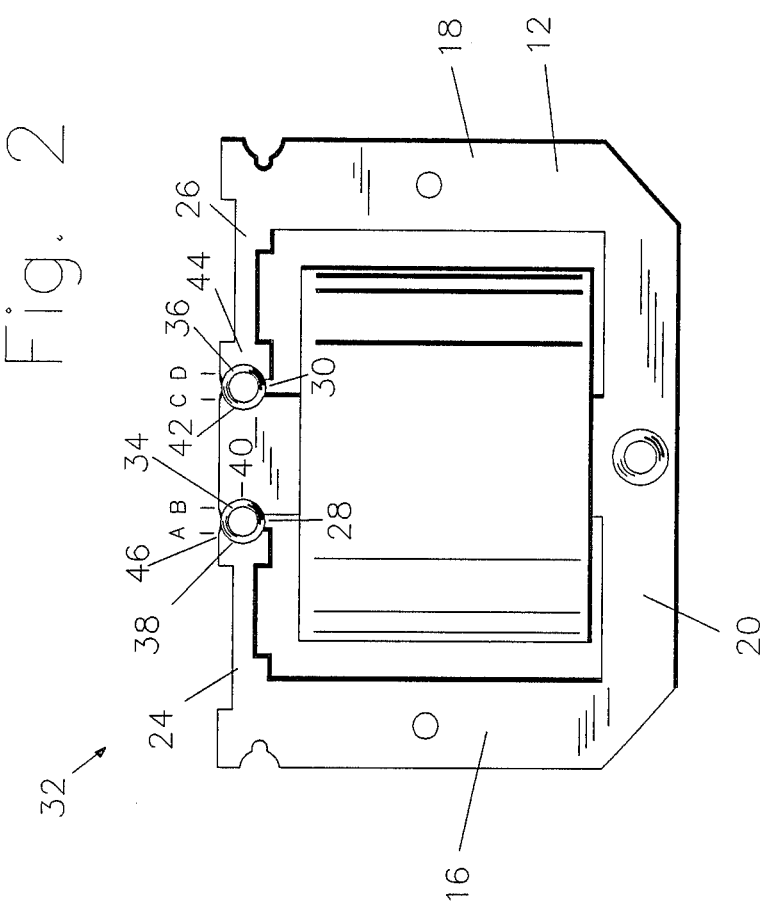
FIG. 2 is a side view of a voltage stator according to an embodiment of the invention.

Referring now to FIG. 2, there is shown, generally at 32, a voltage stator according to an embodiment of the invention. In most respects, voltage stator 32 is identical to voltage stator 10 of FIG. 1. For convenience in relating the elements of voltage stator 32 (FIG. 2) to those in voltage stator 10 (FIG. 1), the same reference designators are employed for unchanged elements and the same reference designators primed are employed for corresponding elements which are modified in the present invention.

In particular, auxiliary air gaps 28' and 30' are modified by the presence of non-magnetic spacers 34 and 36 therein. In the preferred embodiment, non-magnetic spacers 34 and 38 are hollow cylinders of a non-magnetic metal such as, for example, a stainless steel such as L-605 from Atek Metal Center, Inc. or any AISA Type 310 stainless steel. Such materials may be chosen to produce a flux in auxiliary air gaps 28' and 30' corresponding generally to that which would occur in the presence of air.

A semi-cylindrical groove 38 in an end of magnetic circuit closure bar 24' and a facing semi-cylindrical groove 40 in center leg 14' accommodate non-magnetic spacer 34. Similarly, facing semi-cylindrical grooves 42 and 44 in center leg 14' and magnetic circuit closure bar 26', respectively accommodate non-magnetic spacer 36. A pair of welds 46 secure each of non-magnetic spacers 34 and 36 in their respective auxiliary air gaps.

The light load error contributed by a voltage stator before setting its light load adjustment (not shown) is herein called the inherent light load error of voltage stator 32. An inherent light load error may be positive, in which light load errors add to disk speed, negative, in which they subtract from disk speed, or zero, in which they have no influence on disk speed.

We have discovered that the manner of making welds 46 and, in particular, the sequence in which such welds are produced can have a substantial influence on the magnitude and direction of inherent light load error in final voltage stator 32. For purposes of subsequent description, the two welds 46 securing non-magnetic spacer 34 are identified with the letters A and B, and those securing non-magnetic spacer 36 are identified with the letters C and D.

Figure 3:
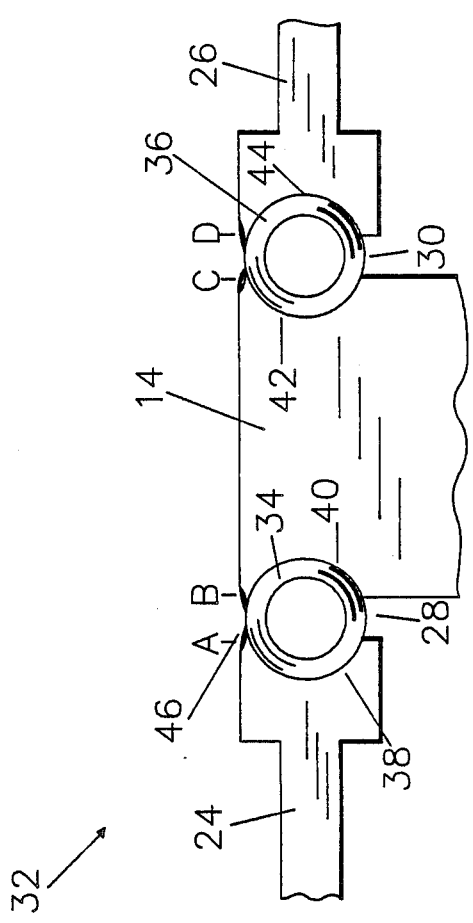
FIG. 3 is a closeup view of a portion of the voltage stator of FIG. 2 showing auxiliary air gaps thereof.
Figure 4:
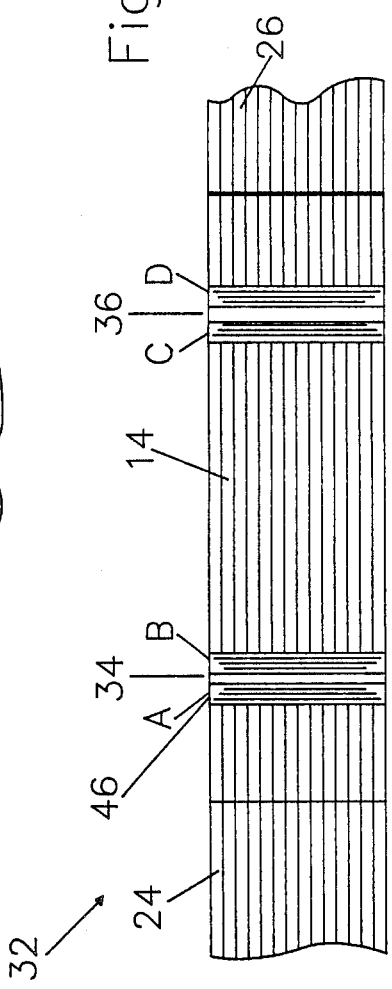
FIG. 4 is a view corresponding to FIG. 3 rotated 90 degrees to show a further view of the auxiliary air gaps.
Figure 5A:
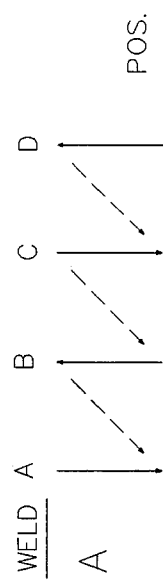
FIGS. 5A–5D show the effect of welding pass sequences on inherent light load error.
Figure 5B:
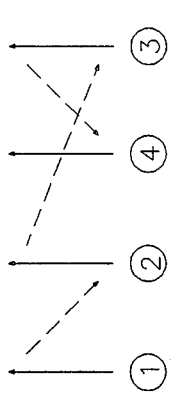
Figure 5C:
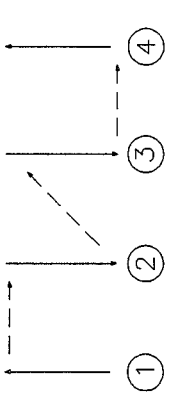
Figure 5D:
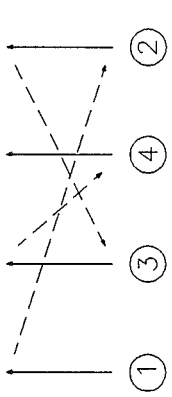

Referring now to FIGS. 3 and 4 showing closeups of the area of voltage stator 32 containing welds 46, it will be seen that each pair of welds 46 securing a non-magnetic spacer are parallel and non-touching. Each weld 46 is made in a single pass, preferably employing an industrial laser, industrial electron-beam, or other suitable heating device. In addition, a metal, inert-gas (MIG) welding technique may be employed. Electron-beam apparatus suffers from shielding and throughput problems. Metal, inert-gas welding techniques conventionally require post-welding cleaning of the weld to remove contaminant artifacts. We have discovered that an industrial laser such as, for example, an S-48 laser commercially available from Coherent General, avoids the drawbacks of competing devices and produces satisfactory welds 46. The S-48 laser is a carbon dioxide laser having an output power adjustable from about 200 to about 800 watts and an enhanced pulse mode of about 2000 watts produces satisfactory welds. In all of the above types of welding done in the atmosphere, a shielding gas at the point of welding is desirable to prevent oxidation of the weld. One satisfactory shielding gas is argon.

Using an industrial laser, the laser beam is aimed at the interface between the magnetic circuit closure bars 24 and the non-magnetic spacers 34, whereby the line of material heating is about equally spread between the two materials.

Although other techniques may be used to control the path of the welding apparatus for achieving a desired sequence for forming welds 46, we have discovered that a conventional X-Y positioning table (not shown) is convenient. Voltage stator 32 is mounted on the positioning table which is then driven along X and Y axes normal to the beam direction under manual or computer control to attain the desired speeds and weld sequences. The penetration of welds 46 into the material is controlled largely by the power of the laser beam. We have found that, for the specified materials, a laser power output of from about 400 to about 600 watts produces suitable welds with outputs of from about 450 to about 550 watts being preferred. At these power ranges, a transport speed on each welding pass of from about 25 to about 60 inches per second produces satisfactory results with a transport speed of from about 27 to about 40 inches per second being preferred. Although some interaction between laser power and transport speed may be demonstrated, the minimum useful laser power is that below which satisfactory material penetration is not attained. The maximum laser power is that above which excessive loss of magnetic material substantially changes auxiliary air gaps 28' and 30'.

Other combinations of laser power and workpiece transport speed may be selected giving corresponding results without departing from the spirit and scope of the invention. Different types of material in magnetic circuit disclosures 24' and 26, as well as in non-magnetic spacers 34 and 36 may rquire changes in one or both of laser power and workpiece transport speed. One skilled in the art with the present disclosure for reference would be fully enabled to select such changed parameters without requiring experimentation.

Referring now to FIGS. 5A–5D, four acceptable weld sequences are shown, together with their effect on inherent light load error. The path during which welding is performed is shown in solid line and the non-welding return paths are shown in dashed line. The sequence in FIG. 5A, for example, employs reversing directions passing from welds D, C, B, and A. The resultant effect is a positive inherent light load error. In contrast, the pattern in FIG. 5B employs welding passes all in the same direction, using the sequence A, B, D, and C to produce zero inherent light load error. The welding sequences in FIGS. 5C and 5D produce inherent light load errors in the negative direction and zero respectively. The above sequences are illustrative only and are not intended to be exhaustive. Other sequences with predictable effects on inherent light load error may be discovered and all such sequences should be considered part of the present invention.

The ability to bias inherent light load error may be useful in the design of a light load adjustment. For example, it may be useful to know beforehand the amount and direction of inherent light load error expected in a voltage stator 32 since this is the direction and an indication of the amountof subsequent adjustment which will be required to overcome it. If a predictable negative bias in inherent light load error can be produced by performing the welding sequence in FIG. 5B, an apparatus for light load adjustment may be required only to increase disk speed at light load and not be expected to retard such disk speed.

Although patentability is not conditioned on a particular theory to explain the effect we disclose herein, and we do not intend to be bound to any particular theory to explain the effect of welding sequences on inherent light load adjustment, we believe that the expansion and contraction of the weld nugget in welds 46, and/or of non-magnetic spacers 34 and 36, as they are heated and cooled during the welding process, may have an effect on the dimensions and other parameters of auxiliary air gaps 28' and 30' (FIGS. 2 and 3).

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A voltage stator comprising:
a substantially E-shaped core;
a voltage stator coil on said E-shaped core;
first and second auxiliary air gaps in said E-shaped core;
first and second grooves in facing surfaces of said first auxiliary air gap;
a first non-magnetic metallic spacer in said first and second grooves;
third and fourth grooves in facing surfaces of said second auxiliary air gap;
a second non-magnetic spacer in said third and fourth grooves;
a first weld at an interface of said first groove and said first non-magnetic metallic spacer;
said first weld uniting contiguous portions of said E-shaped core and said first non-magnetic spacer;
a second weld at an interface of said second groove and said first non-magnetic metallic spacer;
said second weld uniting contiguous portions of said E-shaped core and said first non-magnetic spacer;
said first and second welds being substantially parallel and non-touching;
a third weld at an interface of said third groove and said second non-magnetic metallic spacer;
said third weld uniting contiguous portions of said E-shaped core and said second non-magnetic spacer;
a fourth weld at an interface of said fourth groove and said second non-magnetic metallic spacer;
said fourth weld uniting contiguous portions of said E-shaped core and said second non-magnetic spacer; and
said third and fourth welds being substantially parallel and non-touching.

2. A voltage stator according to claim 1 wherein said first and second non-magnetic metallic spacers are cylindrical.

3. A voltage stator according to claim 2 wherein said first, second, third and fourth grooves are semi-cylindrical, wherein each includes a radius substantially equal to the radius of said first and second non-magnetic metallic spacers.

4. A method for stabilizing first and second auxiliary air gaps in a core of a voltage stator, comprising:
forming first and second facing grooves in facing surfaces of said first auxiliary air gap;
inserting a first non-magnetic metallic spacer in said first and second facing grooves;
said first non-metallic spacer forming first and second interface lines with contiguous portions of said voltage stator core;
forming third and fourth facing grooves in facing surfaces of said second auxiliary air gap;
inserting a second non-magnetic metallic spacer in said third and fourth facing grooves;

said second non-metallic spacer forming third and fourth interface lines with contiguous portions of said second auxiliary air gap;

forming a first weld in a first direction at a first one of said first, second, third and fourth interface lines;

forming a second weld in a second direction at a second one of said first, second, third and fourth interface lines;

forming a third weld in a third direction at a third one of said first, second, third and fourth interface lines;

forming a fourth weld in a fourth direction at a fourth one of said first, second, third and fourth interface lines; and selecting a sequence of said first one, second one, third one and fourth one effective for controlling an inherent light load error in said voltage stator.

5. A method according to claim 4 wherein said first, second, third and fourth grooves are semi-cylindrical and said first and second non-magnetic metallic spacers are cylindrical 6. A method according to claim 4 wherein the step of selecting a sequence is selectively effective for one of producing a positive inherent light load error, producing a negative inherent light load error, and producing a substantially zero inherent light load error.

7. A method for stabilizing first and second auxiliary air gaps in a voltage stator comprising:

affixing a first non-magnetic metallic spacer in said first auxiliary air gap using first and second welds;

affixing a second non-magnetic metallic spacer in said second auxiliary air gap using third and fourth welds; and selecting a sequence of said first, second, third and fourth welds giving a selectable one of a positive, negative and zero inherent light load error.

* * * * *